United States Patent
Ishibashi

(10) Patent No.: US 9,117,758 B2
(45) Date of Patent: Aug. 25, 2015

(54) SUBSTRATE, SEMICONDUCTOR DEVICE, AND METHOD OF MANUFACTURING THE SAME

(71) Applicant: SUMITOMO ELECTRIC INDUSTRIES, LTD., Osaka-shi, Osaka (JP)

(72) Inventor: Keiji Ishibashi, Itami (JP)

(73) Assignee: SUMITOMO ELECTRIC INDUSTRIES, LTD., Osaka-shi, Osaka (JP)

(*) Notice: Subject to any disclaimer, the term of this patent is extended or adjusted under 35 U.S.C. 154(b) by 0 days.

(21) Appl. No.: 14/495,259

(22) Filed: Sep. 24, 2014

(65) Prior Publication Data

US 2015/0008453 A1    Jan. 8, 2015

Related U.S. Application Data

(63) Continuation of application No. 13/564,779, filed on Aug. 2, 2012, now Pat. No. 8,872,189.

(60) Provisional application No. 61/515,392, filed on Aug. 5, 2011.

(30) Foreign Application Priority Data

Aug. 5, 2011    (JP) ................................ 2011-171505

(51) Int. Cl.
*H01L 31/0312*    (2006.01)
*H01L 21/304*    (2006.01)
(Continued)

(52) U.S. Cl.
CPC .............. *H01L 21/304* (2013.01); *C30B 29/36* (2013.01); *C30B 33/00* (2013.01);
(Continued)

(58) Field of Classification Search
CPC .. C30B 29/36; H01L 21/02008; H01L 21/304
USPC .......................................................... 257/77
See application file for complete search history.

(56) References Cited

U.S. PATENT DOCUMENTS

| 8,436,366 B2 | 5/2013 | Harada et al. |
| 2002/0059898 A1 | 5/2002 | Landini et al. |

(Continued)

FOREIGN PATENT DOCUMENTS

| JP | 2004/168649 A | 6/2004 |
| JP | 2004/262709 A | 9/2004 |

(Continued)

*Primary Examiner* — David S Blum
(74) *Attorney, Agent, or Firm* — Drinker Biddle & Reath LLP

(57) ABSTRACT

A substrate capable of achieving a lowered probability of defects produced in a step of forming an epitaxial film or a semiconductor element, a semiconductor device including the substrate, and a method of manufacturing a semiconductor device are provided. A substrate is a substrate having a front surface and a back surface, in which at least a part of the front surface is composed of single crystal silicon carbide, the substrate having an average value of surface roughness Ra at the front surface not greater than 0.5 nm, a standard deviation σ of that surface roughness Ra not greater than 0.2 nm, an average value of surface roughness Ra at the back surface not smaller than 0.3 nm and not greater than 10 nm, standard deviation σ of that surface roughness Ra not greater than 3 nm, and a diameter D of the front surface not smaller than 110 mm.

11 Claims, 3 Drawing Sheets

(51) Int. Cl.
| | |
|---|---|
| *H01L 21/02* | (2006.01) |
| *H01L 29/16* | (2006.01) |
| *C30B 29/36* | (2006.01) |
| *C30B 33/00* | (2006.01) |
| *H01L 21/28* | (2006.01) |
| *H01L 29/34* | (2006.01) |
| *H01L 29/36* | (2006.01) |
| *H01L 29/45* | (2006.01) |
| *H01L 29/49* | (2006.01) |
| *H01L 29/66* | (2006.01) |
| *H01L 29/78* | (2006.01) |
| *H01L 29/04* | (2006.01) |

(52) U.S. Cl.
CPC ..... *H01L 21/0201* (2013.01); *H01L 21/02002* (2013.01); *H01L 21/02008* (2013.01); *H01L 21/0243* (2013.01); *H01L 21/02378* (2013.01); *H01L 21/02529* (2013.01); *H01L 21/28* (2013.01); *H01L 29/1608* (2013.01); *H01L 29/045* (2013.01); *H01L 29/34* (2013.01); *H01L 29/36* (2013.01); *H01L 29/45* (2013.01); *H01L 29/4966* (2013.01); *H01L 29/66068* (2013.01); *H01L 29/7802* (2013.01); *H01L 29/7813* (2013.01); *Y10T 428/21* (2015.01)

(56) References Cited

U.S. PATENT DOCUMENTS

| | | |
|---|---|---|
| 2004/0134418 A1 | 7/2004 | Hirooka |
| 2006/0220027 A1 | 10/2006 | Takahashi et al. |
| 2006/0225645 A1 | 10/2006 | Powell et al. |
| 2006/0267024 A1 | 11/2006 | Murphy et al. |
| 2008/0146004 A1 | 6/2008 | Matocha et al. |
| 2008/0248631 A1 | 10/2008 | Letertre et al. |
| 2009/0209090 A1 | 8/2009 | Yokoyama et al. |
| 2011/0165764 A1 | 7/2011 | Sasaki et al. |
| 2011/0233562 A1 | 9/2011 | Harada et al. |
| 2011/0291104 A1 | 12/2011 | McClure et al. |

FOREIGN PATENT DOCUMENTS

| | | |
|---|---|---|
| JP | 2006/327931 A | 12/2006 |
| JP | 2010/265126 A | 11/2010 |
| WO | WO-2010/119792 A1 | 10/2010 |

SUBSTRATE, SEMICONDUCTOR DEVICE, AND METHOD OF MANUFACTURING THE SAME

RELATED APPLICATION DATA

This application is a continuation of U.S. patent application Ser. No. 13/564,779, filed Aug. 2, 2012, which claims the benefit of priority to U.S. Provisional Application No. 61/515,392 filed Aug. 5, 2011 and Japanese Patent Application No. 2011-171505, filed Aug. 5, 2011, each of which is incorporated by reference herein in its entirety.

BACKGROUND OF THE INVENTION

1. Field of the Invention

This invention relates to a substrate, a semiconductor device, and a method of manufacturing the same, and more particularly to a substrate in which at least a part of a front surface is composed of silicon carbide, a semiconductor device, and a method of manufacturing the same.

2. Description of the Background Art

A substrate in which at least a part of a front surface is composed of silicon carbide, such as a silicon carbide single crystal substrate, has conventionally been known. Since such silicon carbide is higher in thermal conductivity than a nitride semiconductor such as gallium nitride (GaN), a substrate composed of silicon carbide is expected as a material for a power device for controlling a high voltage and a high current. For example, United States Patent Publication No. 2006/0225645 (hereinafter referred to as PTL 1) discloses a silicon carbide substrate having a diameter of 3 inches, for which a value for warp or TTV (Total Thickness Variations) is defined in order to prevent film quality of an obtained epitaxial film from deteriorating due to non-uniform temperature distribution at the time of forming an epitaxial film on a front surface thereof. In addition, WO2010/119792 (hereinafter referred to as PTL 2) discloses definition of a characteristic specifying a shape, such as warp or bow of a substrate, and setting a value for surface roughness Ra on a front surface side of the substrate to 1 nm or smaller and setting a value for surface roughness Ra on a back surface side of the substrate to 100 nm or smaller. PTL 2 defines surface roughness as above, in order to ensure a prescribed shape of a substrate when a thin film is formed on the front surface of the substrate.

PTL 1 described above does not particularly mention surface roughness of a substrate. Though PTL 2 defines surface roughness of a front surface and a back surface of the substrate in order to ensure a prescribed shape of the substrate, it does not mention either relation between surface roughness of the substrate (in particular, surface roughness on the back surface side) and film quality of an epitaxial film or the like formed on the front surface of the substrate.

As a result of the inventor's dedicated studies, however, the inventor has found that, when surface roughness in particular on a back surface side of a substrate is great, during heating treatment in a step of growing an epitaxial film on a front surface of the substrate, a state of contact between a susceptor on which the substrate is carried and the back surface of the substrate varies and consequently temperature distribution is produced in the substrate. Such temperature distribution may adversely affect film quality of the formed epitaxial film.

In addition, in steps of forming an epitaxial film on the front surface of the substrate and forming a semiconductor element on the epitaxial film, the back surface of the substrate may be stuck by vacuum. If surface roughness at the back surface is great during such sticking by vacuum, the substrate cannot reliably be stuck in some cases. Consequently, defects may be produced in the step of forming a semiconductor element.

Furthermore, when surface roughness at the back surface of the substrate is great, a crystal defect may develop from the back surface side of the substrate during heating treatment for forming an epitaxial film and the substrate may warp. Then, in the case where a substrate is increased in size, an absolute value of an amount of warp of the substrate becomes great, which may result in a factor for causing defects in a step of forming an epitaxial film or forming an element.

SUMMARY OF THE INVENTION

This invention was made to solve the above-described problems, and an object of this invention is to provide a substrate capable of achieving a lowered probability of defects produced in a step of forming an epitaxial film or a semiconductor element, a semiconductor device including the substrate, and a method of manufacturing the same.

A substrate according to this invention is a substrate having a front surface and a back surface, in which at least a part of the front surface is composed of silicon carbide, an average value of surface roughness Ra at the front surface is not greater than 0.5 nm and a standard deviation of that surface roughness Ra is not greater than 0.2 nm, an average value of surface roughness Ra at the back surface is not smaller than 0.3 nm and not greater than 10 nm and a standard deviation of that surface roughness Ra is not greater than 3 nm, and a diameter of the front surface is not smaller than 110 mm.

By doing so, in a step of forming an epitaxial layer on the front surface of the substrate, local change in a state of contact between a susceptor supporting the substrate and the back surface of the substrate can be suppressed. Therefore, occurrence of such a problem as uneven temperature distribution in the substrate with change in a state of contact can be suppressed and consequently an epitaxial layer excellent in film quality can be formed.

Here, depending on a material for a substrate, a surface state suitable for forming an epitaxial layer or forming a device is different and influence by surface roughness thereof is also different. Namely, surface roughness suitable for forming an epitaxial layer or the like is different between a substrate in which at least a part of the front surface is composed of silicon carbide according to the present invention and a substrate composed of other semiconductor materials. In addition, since mechanical and chemical durability is different depending on a material, a working condition (a polishing condition) for controlling a process-damaged layer or surface roughness at the front surface is different for each substrate made of a different material. Therefore, an appropriate working method is also different between the substrate composed of silicon carbide according to the present invention and a substrate made of other materials.

Based on such findings, in the substrate according to the present invention, an average value of surface roughness Ra at the back surface is controlled to be not smaller than 0.3 nm and not greater than 10 nm and a standard deviation thereof is controlled to be not greater than 3 nm. Thus, in growing an epitaxial film on the front surface of the substrate, production or development of a crystal defect on the back surface side can be suppressed and consequently warp of the substrate can also be suppressed. Consequently, a probability of production of a defect attributed to warp of the substrate can be lowered in a step of forming an epitaxial film or in a subsequent step of forming an element.

It is noted that surface roughness Ra refers to arithmetic mean roughness Ra defined under JIS B 0601, and it is defined as a value calculated by extracting a reference length from a roughness curve in a direction of an average line thereof and summing and averaging distances from the average line of this extracted segment to a measurement curve (an absolute value of a deviation). An average value of surface roughness Ra at the front surface of the substrate is not greater than 0.5 nm as described above, however, it is preferably not smaller than 0.1 nm and not greater than 0.3 nm. With surface roughness Ra being not greater than 0.5 nm, a good epitaxially grown layer can be formed on the front surface of the substrate. In addition, with surface roughness Ra being not smaller than 0.1 nm, increase in the number of steps in polishing treatment such as CMP (Chemical Mechanical Polish) is suppressed and lowering in yield is suppressed. Thus, excessive increase in manufacturing cost can be avoided.

In addition, though a standard deviation σ of surface roughness Ra at the front surface of the substrate is not greater than 0.2 nm as described above, it is preferably not greater than 0.1 nm and more preferably not greater than 0.05 nm. With standard deviation σ being not greater than 0.2 nm as such, a uniform epitaxially grown layer can be formed on the front surface of the substrate.

Moreover, though an average value of surface roughness Ra at the back surface is not smaller than 0.3 nm and not greater than 10 nm, it is preferably not smaller than 0.4 nm and not greater than 5 nm and more preferably not smaller than 0.5 nm and not greater than 2 nm. It is noted that, when the average value of surface roughness Ra at the back surface is not smaller than 10 nm, a state of contact between the susceptor and the back surface of the substrate locally changes (varies) in the step of forming an epitaxially grown layer. Therefore, temperature distribution in the substrate becomes non-uniform and quality of a resultant epitaxial layer may lower. Furthermore, a problem of great warp of the substrate due to extension of a crystal defect from the back surface of the substrate during heating occurs and yield in a device step may lower. In order to set the average value of surface roughness Ra at the back surface to less than 0.3 nm, highly sophisticated surface treatment is required, which leads to increase in cost for manufacturing a substrate and lower productivity in a process for manufacturing a substrate. For example, in order to set the average value of surface roughness Ra at the back surface of the substrate to less than 0.3 nm, CMP treatment using colloidal silica and chemical components or the like is required, because it is difficult to achieve this value with normal polishing using neutral diamond slurry.

Though standard deviation σ of surface roughness Ra at the back surface is not greater than 3 nm as described above, it is preferably not greater than 1.5 nm and more preferably not greater than 0.7 nm. By doing so, a state of contact between the back surface of the substrate and the susceptor can be substantially uniform over the entire back surface and consequently a uniform epitaxially grown layer can be formed on the front surface of the substrate.

In addition, a diameter of the front surface of the substrate is set to 110 mm or greater. By doing so, the number of semiconductor elements (chips) which can be formed on the substrate can be increased by using a substrate having a large area. Consequently, manufacturing cost in the step of forming a semiconductor element (a device step) can be reduced and productivity can be improved.

A semiconductor device according to this invention includes the substrate above, an epitaxial layer, and an electrode. The epitaxial layer is formed on the front surface of the substrate and composed of silicon carbide. The electrode is formed on the epitaxial layer. In this case, a semiconductor device achieving a lowered probability of production of a defect and suppressed manufacturing cost can be realized.

In addition, a method of manufacturing a substrate according to this invention includes the steps of preparing an ingot composed of silicon carbide, obtaining a substrate having a front surface and a back surface and a diameter of the front surface not smaller than 110 mm by slicing the ingot, and polishing the front surface and the back surface of the substrate. In the polishing step, by controlling a resistance coefficient in the polishing step, the front surface and the back surface are polished such that an average value of surface roughness Ra at the front surface is not greater than 0.5 nm and a standard deviation of surface roughness Ra is not greater than 0.2 nm and such that an average value of surface roughness Ra at the back surface is not smaller than 0.3 nm and not greater than 10 nm and a standard deviation of surface roughness Ra is not greater than 3 nm. In this case, the substrate according to the present invention can reliably be obtained.

A method of manufacturing a semiconductor device according to this invention includes the steps of preparing the substrate above, forming an epitaxial layer composed of silicon carbide on the front surface of the substrate, and forming an electrode on the epitaxial layer. In this case, by using the substrate according to the present invention, a probability of production of a defect is lowered and cost for manufacturing a semiconductor device can be suppressed.

According to the present invention, a substrate capable of allowing formation of an epitaxially grown film having good film quality and lowering a probability of production of a defect, a semiconductor device, and a method of manufacturing the same can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
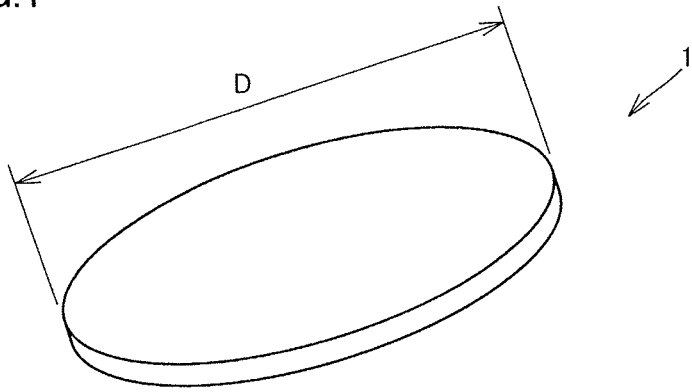
FIG. 1 is a perspective schematic diagram showing an embodiment of a substrate according to the present invention.

An embodiment of the present invention will be described hereinafter with reference to the drawings. It is noted that, in the drawings below, the same or corresponding elements have the same reference characters allotted and description thereof will not be repeated.

An embodiment of a substrate according to the present invention will be described with reference to FIGS. 1 and 2.

Figure 2:
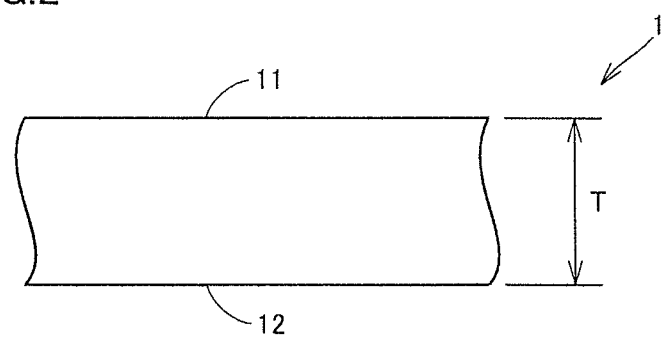
FIG. 2 is a partial cross-sectional schematic diagram of the substrate shown in FIG. 1.

A substrate 1 shown in FIGS. 1 and 2 is substrate 1 composed of single crystal of silicon carbide, and an average value of surface roughness Ra at a front surface 11 of substrate 1 is not greater than 0.5 nm and a standard deviation σ of surface roughness Ra is not greater than 0.2 nm. In addition, an average value of surface roughness Ra at a back surface 12 of substrate 1 is not smaller than 0.3 nm and not greater than 10 nm and standard deviation σ of surface roughness Ra is not greater than 3 nm. Moreover, a diameter D of the front surface of substrate 1 is not smaller than 110 mm. Thus, in substrate 1 of which surface roughness is controlled also for back surface 12 in addition to front surface 11, a state of contact between back surface 12 and a susceptor of a film formation apparatus on which substrate 1 is carried can be made uniform over the entire back surface 12 in growing an epitaxial film composed of silicon carbide on front surface 11. Therefore, temperature distribution produced in substrate 1 attributed to occurrence of local variation in a state of contact can be suppressed. Therefore, uniformity in film quality such as crystallinity of or impurity concentration in a formed epitaxial film can be improved. Consequently, variation in characteristics of a semiconductor device formed by making use of the epitaxial film can be suppressed and yield of a resultant semiconductor device can be improved.

In addition, substrate 1 satisfies relational expressions of $100 \leq D/T \leq 1000$ and $0 \leq Wb/T \leq 0.2$, where D (see FIG. 1) represents a diameter of front surface 11, T (see FIG. 2) represents a thickness of substrate 1, and Wb represents warp of the back surface in substrate 1 above. In this case, the present invention is applied to relatively large substrate 1 less in warp, and an effect of the present invention that a probability of a defect produced in a step of forming an epitaxial film or a process for manufacturing a semiconductor device can be lowered is more significant.

A method of manufacturing substrate 1 composed of silicon carbide, shown in FIGS. 1 and 2, will be described next with reference to FIG. 3.

Figure 3:
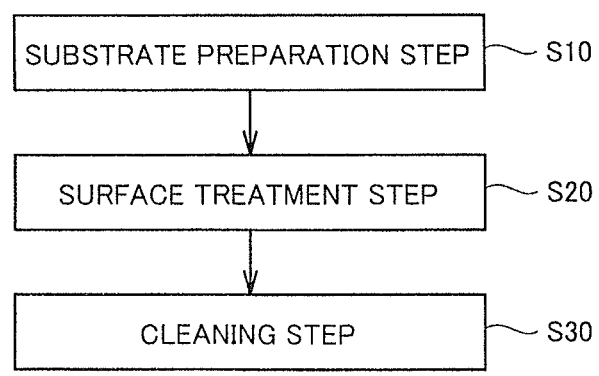
FIG. 3 is a flowchart for illustrating a method of manufacturing the substrate shown in FIG. 1.

Referring to FIG. 3, initially, a substrate preparation step (S10) is performed. Here, a substrate composed of silicon carbide, which is an object to be worked and of which surface roughness is to be adjusted, is prepared. Specifically, for example, a crystal growth step (S11) for epitaxially growing silicon carbide on a seed substrate is performed. Thus, an ingot composed of silicon carbide and having a size to some extent is obtained.

Then, an ingot shaping step (S12) is performed. Specifically, a front surface, a back surface, an outer circumference, and the like of an ingot obtained in the step (S11) described above are ground to obtain an ingot having prescribed shape and plane orientation.

Then, a slicing step (S13) is performed. In this step (S13), the ingot obtained as described above is sliced by using a wire saw or the like. Consequently, a substrate composed of silicon carbide, which is an object to be worked and of which surface roughness is to be adjusted, is obtained.

Then, as shown in FIG. 3, a surface treatment step (S20) is performed. Specifically, a grinding step (S21) for grinding the front surface and the back surface of the substrate with any conventionally well-known method is performed. Through this step (S21), a thickness of the substrate is adjusted so that surface roughness Ra on the front surface side and the back surface side of the substrate is reduced to a certain value.

Then, a polishing step (S22) is performed. In this step (S22), the front surface and the back surface of the substrate are polished by using, for example, a lapping apparatus or a CMP apparatus. Through this step (S22), front surface 11 and back surface 12 having surface roughness Ra as described above are obtained.

Then, a cleaning step (S30) shown in FIG. 3 is performed. Specifically, the front surface and the back surface of the polished substrate are cleaned with any conventionally well-known method. Thus, substrate 1 composed of silicon carbide, shown in FIGS. 1 and 2, can be obtained.

Figure 4:
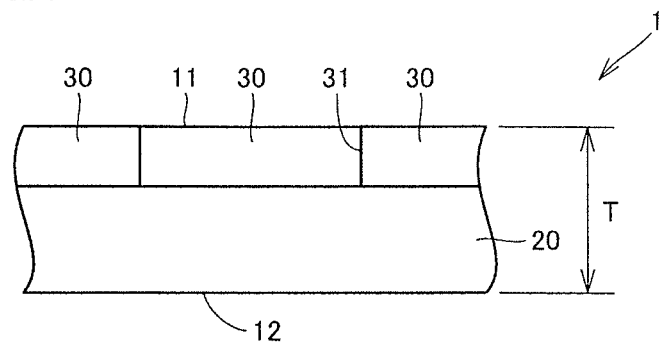
FIG. 4 is a partial cross-sectional schematic diagram of a variation of the embodiment of the substrate according to the present invention.

The present invention is applicable not only to a substrate composed of single crystal SiC as described above but also to a bonded substrate (a combined substrate) as shown in FIG. 4. A variation of the embodiment of the substrate according to the present invention will be described with reference to FIG. 4.

Referring to FIG. 4, substrate 1 which is a variation of the embodiment of the substrate according to the present invention is a bonded substrate obtained by joining a plurality of single crystal tile substrates 30 composed of single crystal silicon carbide to a front surface of a base substrate 20. By bonding small-piece single crystal substrates of high quality to an inexpensive, large base substrate, a large-diameter substrate excellent in crystal quality of the front surface can be fabricated with low cost.

A gap between the plurality of single crystal tile substrates 30 is preferably buried at a joint surface 31. Though a material for base substrate 20 is not particularly limited, a substrate composed of silicon carbide is preferably used in terms of heat resistance and strength. Silicon carbide may be in any form of single crystal, polycrystal, and a sintered body having many dislocations or defects.

In this substrate 1 as well, an average value of surface roughness Ra at front surface 11, which is a surface where single crystal silicon carbide is exposed and on which an epitaxial film or the like is to be formed, can be not greater than 0.5 nm and standard deviation σ thereof can be not greater than 0.2 nm. In addition, an average value of surface roughness Ra at back surface 12 is not smaller than 0.3 nm and not greater than 10 nm and standard deviation σ thereof is not greater than 3 nm. Such substrate 1 can also achieve an effect the same as that obtained with the substrate shown in FIGS. 1 and 2.

A method of manufacturing substrate 1 shown in FIG. 4 will briefly be described. A method of manufacturing substrate 1 shown in FIG. 4 is basically the same as the method of manufacturing substrate 1 shown in FIGS. 1 and 2, however, the substrate preparation step (S10) shown in FIG. 3 is different from that in the method of manufacturing the substrate shown in FIGS. 1 and 2. Namely, in the method of manufacturing substrate 1 shown in FIG. 4, though the same steps are performed until the crystal growth step (S11), the ingot shaping step (S12), and the slicing step (S13) previously described as the substrate preparation step (S10) shown in FIG. 3, subsequently, a tile substrate forming step (S14) for forming single crystal tile substrate 30 (see FIG. 4) is performed. In this step (S14), single crystal tile substrate 30 is cut, for example, by using a dicing saw, a wire saw, or the like from the substrate obtained in the slicing step (S13) above. A two-dimensional shape of this single crystal tile substrate 30 can be in any shape such as a polygonal shape including a triangle and a quadrangle, or a circular shape.

Thereafter, a bonding step (S15) is performed. In this step (S15), a plurality of single crystal tile substrates 30 are arranged on base substrate 20 with any method and joined to one another. As a method used in this bonding step (S15), for example, any method such as a method of forming silicon carbide to serve as a joining material with a sublimation method or the like and a method of joint with an adhesive can be used.

Thereafter, substrate 1 shown in FIG. 4 can be obtained by performing the surface treatment step (S20) and the cleaning step (S30) shown in FIG. 3.

A semiconductor device formed with substrate 1 shown in FIG. 1 or 4 will now be described with reference to FIG. 5.

Figure 5:
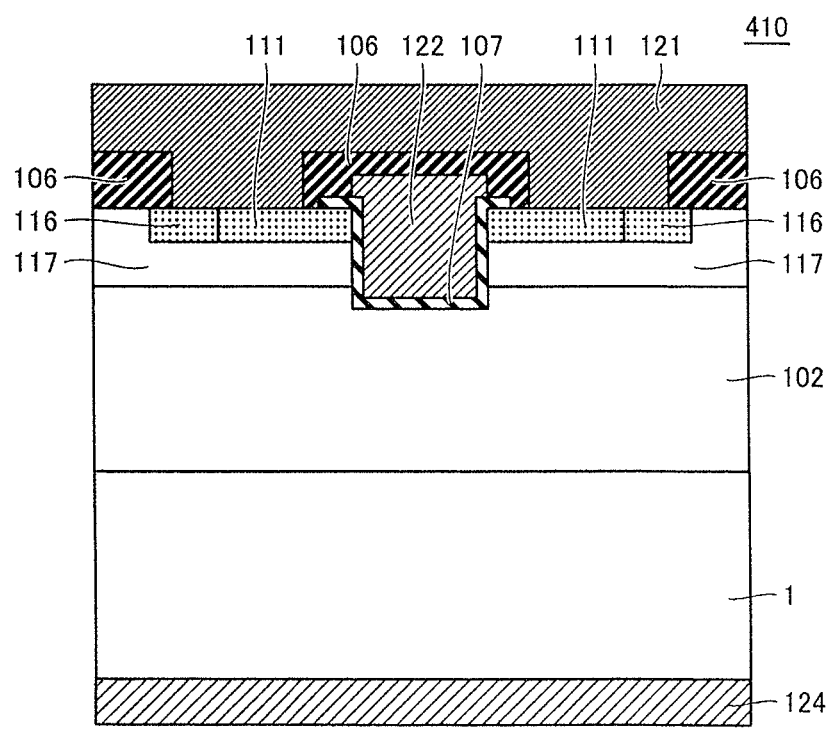
FIG. 5 is a cross-sectional schematic diagram showing an embodiment of a semiconductor device according to the present invention.

A UMOS 410 shown in FIG. 5 includes substrate 1 according to the present invention, an n$^-$ type SiC epitaxial layer 102, a p-type well region 117, a p$^+$ type well contact impurity region 116, a pair of n$^+$ type source impurity regions, a gate insulating film 107 formed on an inner wall surface of a groove formed by partially removing p-type well region 117 and n$^-$ type SiC epitaxial layer 102 between the pair of n$^+$ type source impurity regions, a gate electrode 122 formed on gate insulating film 107 to bury the groove, an interlayer insulating film 106 covering a surface of gate electrode 122 and p-type well region 117, an opening formed in interlayer insulating film 106 to expose a part of an upper surface of an n$^+$ type source impurity region 111 and the p$^+$ type well contact impurity region, a source electrode 121 connected to n$^+$ type source impurity region 111 and p$^+$ type well contact impurity region 116 through the opening, and a drain electrode 124 formed on the back surface of substrate 1.

In UMOS 410 shown in FIG. 5, gate insulating film 107 is formed to cover a side surface extending in an up/down direction of the groove formed in p-type well region 117 and a bottom surface extending in a left/right direction and opposed to a lowermost portion of gate electrode 122. It is noted that the p-type and the n-type of each component described above may all be reversed.

An operation of UMOS 410 will now be described. An inversion layer due to electrons can be formed in accordance with voltage application to gate electrode 122, on the side surface (in the vicinity of the joint surface) of p-type well region 117 along gate insulating film 107. Then, in accordance with a potential difference between source electrode 121 and drain electrode 124, a current that has passed through n$^+$ type source impurity region 111, the inversion layer in p-type well region 117, n$^-$ type SiC epitaxial layer 102, and substrate 1 which is an n$^+$ type SiC substrate can be applied across source electrode 121 and drain electrode 124. The current between source electrode 121 and drain electrode 124 at this time flows along gate insulating film 107.

Since UMOS 410 shown in FIG. 5 includes substrate 1 according to the present invention, temperature distribution in substrate 1 has been made uniform by the time of formation of n$^-$ type SiC epitaxial layer 102. Therefore, n$^-$ type SiC epitaxial layer 102 has excellent film quality. Thus, UMOS 410 excellent in electrical characteristics can be realized.

Figure 6:
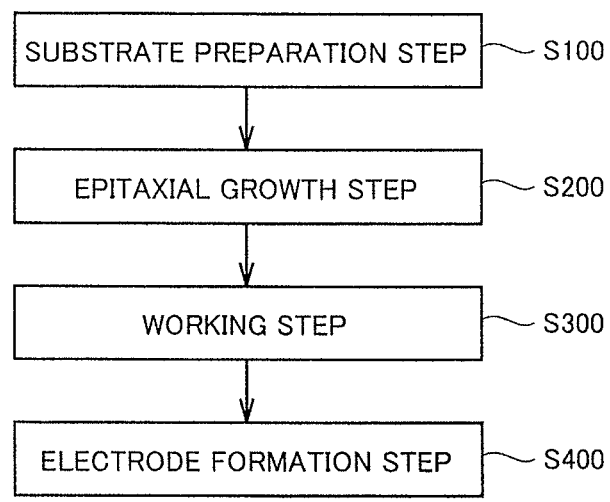
FIG. 6 is a flowchart for illustrating a method of manufacturing the semiconductor device shown in FIG. 5.

A method of manufacturing UMOS 410 shown in FIG. 5 will be described next with reference to FIG. 6. As shown in FIG. 6, in a method of manufacturing UMOS 410, initially, a substrate preparation step (S100) which is a step of preparing substrate 1 is performed. In this step (S100), substrate 1 may be prepared by performing the step of manufacturing a substrate shown in FIG. 3. Then, an epitaxial growth step (S200) which is a step of forming n$^-$ type SiC epitaxial layer 102 on the front surface of substrate 1 is performed. Then, a working step (S300) shown in FIG. 6 is performed. Specifically, a step (S310) of forming p-type well region 117, p$^+$ type well contact impurity region 116, and n$^+$ type source impurity region 111 is performed with ion implantation or the like.

In the step (S300), then, a step (S320) of forming a groove by partially removing p-type well region 117 and n$^-$ type SiC epitaxial layer 102 between the pair of n$^+$ type source impurity regions is performed. In this step (S320), a groove can be formed, for example, by using reactive ion etching (RIE). It is noted that, in order to ensure conduction between source electrode 121 and drain electrode 124 by forming an inversion layer in the vicinity of the side surface of the groove in p-type well region 117, a depth in the up/down direction of the groove is preferably greater than a thickness of p-type well region 117.

Then, an electrode formation step (S400) corresponding to the step of forming a structure other than an epitaxial layer is performed. Specifically, an insulating film to be gate insulating film 107 is formed, for example, with thermal oxidation, on the inner surface of the groove formed with the method above and on the upper surface of p-type well region 117. Thereafter, using a mask pattern formed in a photolithography step as a mask, the insulating film is partially etched away, to thereby form gate insulating film 107 shown in FIG. 5. Gate electrode 122 is formed on gate insulating film 107. In addition, after interlayer insulating film 106 is formed to cover the entirety, interlayer insulating film 106 is partially removed by etching, using a mask pattern formed on interlayer insulating film 106 as a mask. Thus, an opening is formed to expose a part of the upper surface of n$^+$ type source impurity region 111 and the p$^+$ type well contact impurity region. Then, source electrode 121 is formed to connect through the opening to n$^+$ type source impurity region 111 and the p$^+$ type well contact impurity region and to cover interlayer insulating film 106 on gate electrode 122. In addition, drain electrode 124 is formed on the back surface side of substrate 1. UMOS 410 shown in FIG. 5 can thus be obtained.

A variation of the semiconductor device according to the present invention, formed with substrate 1 shown in FIG. 1 or 4, will now be described with reference to FIG. 7.

Figure 7:
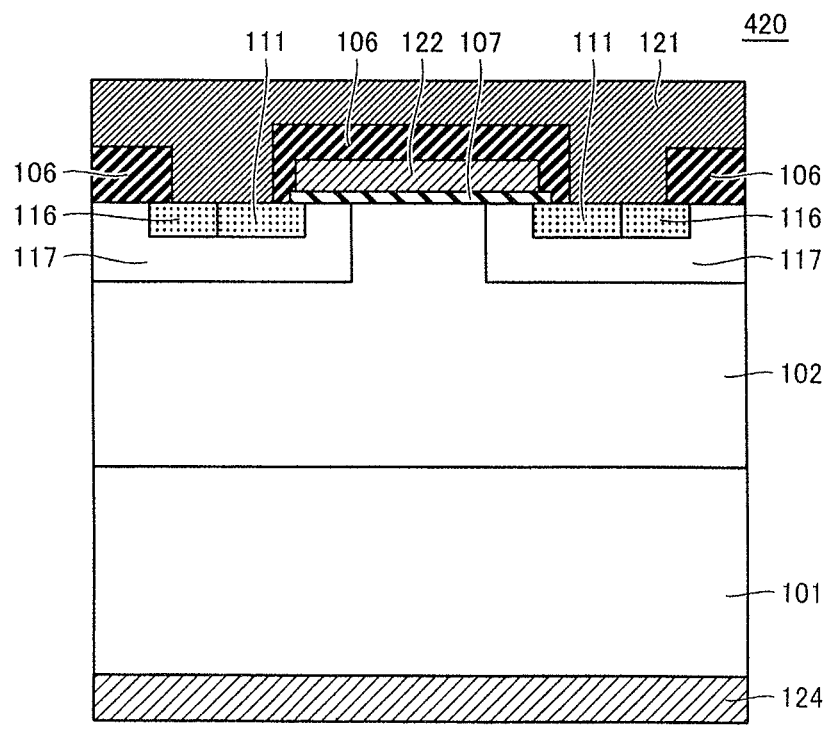
FIG. 7 is a cross-sectional schematic diagram showing a variation of the embodiment of the semiconductor device according to the present invention.

A DMOS 420 shown in FIG. 7 represents one type of vertical MOSFETs. In DMOS 420 in FIG. 7, electrons flow from source electrode 121 into a region of n$^-$ type SiC epitaxial layer 102 opposed to gate insulating film 107 and thereafter electrons are diverted to flow toward drain electrode 124. The DMOS is thus configured such that a current flows between source electrode 121 and drain electrode 124.

Specifically, as shown in FIG. 7, DMOS 420 includes substrate 1 according to the present invention and n$^-$ type SiC epitaxial layer 102 formed on the front surface of substrate 1, similarly to UMOS 410 shown in FIG. 5. In a front surface layer of n$^-$ type SiC epitaxial layer 102, a pair of p-type well regions 117 arranged at a distance from each other is formed. In a front surface of p-type well region 117, p$^+$ type well contact impurity region 116 and n$^+$ type source impurity region 111 are formed. Gate insulating film 107 is formed to extend from the front surface of n$^-$ type SiC epitaxial layer 102 between the pair of p-type well regions 117 to p-type well region 117 and n$^+$ type source impurity region 111 over the same. Gate electrode 122 is formed on gate insulating film 107.

Interlayer insulating film 106 is formed to cover a front surface of gate electrode 122 and p-type well region 117. In interlayer insulating film 106, an opening is formed to expose a part of an upper surface of n$^+$ type source impurity region 111 and the p$^+$ type well contact impurity region. Source electrode 121 connected through the opening to n$^+$ type source impurity region 111 and p$^+$ type well contact impurity region 116 is formed. In addition, drain electrode 124 is formed on the back surface of substrate 1. It is noted that the p-type and the n-type of each component described above may all be reversed.

It is noted that p-type well region 117 has a thickness, for example, of approximately 1.5 μm and may contain aluminum as an impurity by approximately $1\times10^{16}$ cm$^{-3}$. P$^+$ type well contact impurity region 116 may contain aluminum as an impurity by approximately by $1\times10^{19}$ cm$^{-3}$ and may have a thickness of approximately 0.4 μm.

An operation of DMOS 420 will now be described. If a voltage is not applied to gate electrode 122, in DMOS 420, conduction from source electrode 121 to drain electrode 124 is prevented either between n$^+$ type source impurity region 111 and p-type well region 117 or between p-type well region 117 and n$^-$ type SiC epitaxial layer 102, because n$^+$ type source impurity region 111 is of the n-type, p-type well region 117 is of the p-type, and n$^-$ type SiC epitaxial layer 102 is of the n-type. If a negative voltage is applied to gate electrode 122, a storage layer caused by holes of majority carriers is formed in p-type well region 117 covered with gate insulating film 107 under gate electrode 122. Therefore, flow of a current becomes further difficult.

If a positive voltage is applied to gate electrode 122, however, an inversion layer due to electrons is formed in p-type well region 117 covered with gate insulating film 107 under gate electrode 122. Therefore, a depletion layer is not formed in a region extending from n$^+$ type source impurity region 111 to drain electrode 124. Therefore, a current can flow between source electrode 121 and drain electrode 124 depending on a potential difference between these electrodes.

Since DMOS 420 shown in FIG. 7 makes use of substrate 1 according to the present invention, temperature distribution in substrate 1 has been made uniform by the time of formation of n$^-$ type SiC epitaxial layer 102. Therefore, n$^-$ type SiC epitaxial layer 102 has excellent film quality. Thus, DMOS 420 excellent in electrical characteristics can be realized.

It is noted that p$^+$ type well contact impurity region 116 has a role to fix a potential at p-type well region 117 by electrically connecting source electrode 121 and p-type well region 117 to each other. As described above, impurity concentration in p-type well region 117 is as low as $1\times10^{16}$ cm$^{-3}$. Therefore, it is difficult to electrically connect p-type well region 117 and source electrode 121 to each other by directly joining the same. Then, in DMOS 420, p$^+$ type well contact impurity region 116 higher in impurity concentration than p-type well region 117, that is made of a p-type implantation layer identical in type to p-type well region 117, is arranged so as to join source electrode 121. Thus, source electrode 121 and p-type well region 117 can electrically be connected to each other through p$^+$ type well contact impurity region 116.

A method of manufacturing DMOS 420 shown in FIG. 7 will now be described. The method of manufacturing DMOS 420 shown in FIG. 7 is basically the same as the method of manufacturing UMOS 410 shown in FIG. 6, and the step (S100) to the step (S300) in FIG. 6 are performed. Though the step (S310) of forming p-type well region 117, p$^+$ type well contact impurity region 116, and n$^+$ type source impurity region 111 is performed in the step (S300), a groove is not thereafter formed, unlike the method of manufacturing UMOS 410 shown in FIG. 5.

Thereafter, the electrode formation step (S400) is performed. In the step (S400), an insulating film to be gate insulating film 107 is formed, for example, with thermal oxidation, on the upper surface of p$^+$ type well contact impurity region 116, n$^+$ type source impurity region 111, and p-type well region 117. Thereafter, using a mask pattern formed in a photolithography step as a mask, the insulating film is partially etched away, to thereby form gate insulating film 107 shown in FIG. 7. Gate insulating film 107 is formed to cover a part of p-type well region 117 and a part of n$^-$ type SiC epitaxial layer 102 and n$^+$ type source impurity region 111. Thereafter, as in the case of UMOS 410 shown in FIG. 5, gate electrode 122, source electrode 121, and drain electrode 124 are formed. DMOS 420 shown in FIG. 7 can thus be obtained.

Characteristic features of the present invention will be listed here, although they are partially redundant with those in the embodiment described above.

Substrate 1 according to this invention is substrate 1 having front surface 11 and back surface 12, in which at least a part of front surface 11 is composed of single crystal silicon carbide, an average value of surface roughness Ra at front surface 11 is not greater than 0.5 nm and standard deviation σ of surface roughness Ra is not greater than 0.2 nm and an average value of surface roughness Ra at back surface 12 is not smaller than 0.3 nm and not greater than 10 nm and standard deviation σ of surface roughness Ra is not greater than 3 nm, and diameter D of front surface 11 is not smaller than 110 mm.

By doing so, in the step of forming an epitaxial layer (for example, n$^-$ type SiC epitaxial layer 102 in FIG. 5) on front surface 11 of substrate 1, local change in a state of contact between the susceptor supporting the substrate and back surface 12 of substrate 1 can be suppressed. Therefore, occurrence of such a problem as uneven temperature distribution in substrate 1 with change in the state of contact can be suppressed and consequently an epitaxial layer excellent in film quality can be formed.

In addition, by controlling an average value of surface roughness Ra at back surface 12 to be not smaller than 0.3 nm and not greater than 10 nm and a standard deviation thereof to be not greater than 3 μm, in growing an epitaxial film on front surface 11 of substrate 1, production or development of a crystal defect on the back surface 12 side can be suppressed and consequently warp of substrate 1 can also be suppressed. Consequently, a probability of production of a defect attributed to warp of substrate 1 can be lowered in the step of forming an epitaxial film or in a subsequent step of forming an element.

It is noted that an average value of surface roughness Ra at front surface 11 of substrate 1 is not greater than 0.5 nm as described above, however, it is preferably not smaller than 0.1 nm and not greater than 0.3 nm. With surface roughness Ra being not greater than 0.5 nm, a good epitaxial layer (n$^-$ type SiC epitaxial layer 102) can be formed on front surface 11 of substrate 1. In addition, with surface roughness Ra being not smaller than 0.1 nm, increase in the number of steps in polishing treatment such as CMP is suppressed and lowering in yield is suppressed. Thus, excessive increase in manufacturing cost can be avoided.

In addition, though standard deviation σ of surface roughness Ra at front surface 11 of substrate 1 is not greater than 0.2 nm as described above, it is preferably not greater than 0.1 nm and more preferably not greater than 0.05 nm. With standard deviation σ being not greater than 0.2 nm as such, a uniform epitaxial layer can be formed on front surface 11 of substrate 1.

Moreover, though an average value of surface roughness Ra at back surface 12 is not smaller than 0.3 nm and not greater than 10 nm, it is preferably not smaller than 0.4 nm and not greater than 5 nm and more preferably not smaller than 0.5 nm and not greater than 2 nm. It is noted that, when the average value of surface roughness Ra at back surface 12 is not smaller than 10 nm, a state of contact between the susceptor and back surface 12 of substrate 1 locally changes (varies) in the step of forming an epitaxial layer. Therefore, temperature distribution in substrate 1 becomes non-uniform and quality of a resultant epitaxial layer (n⁻ type SiC epitaxial layer 102) may lower. Furthermore, a problem of great warp of substrate 1 due to extension of a crystal defect from back surface 12 of substrate 1 during heating occurs and yield in a device step which is a step of forming a semiconductor element on substrate 1 may lower. In order to set the average value of surface roughness Ra of back surface 12 to less than 0.3 nm, highly sophisticated surface treatment is required, which leads to increase in cost for manufacturing substrate 1 and lower productivity in a process for manufacturing substrate 1. For example, in order to set the average value of surface roughness Ra at back surface 12 of substrate 1 to less than 0.3 nm, CMP treatment using colloidal silica and chemical components or the like is required, because it is difficult to achieve this value with normal polishing using neutral diamond slurry.

Though standard deviation σ of surface roughness Ra at back surface 12 is not greater than 3 nm as described above, it is preferably not greater than 1.5 nm and more preferably not greater than 0.7 nm. By doing so, a state of contact between back surface 12 of substrate 1 and the susceptor can be substantially uniform over the entire back surface and consequently a uniform epitaxial layer can be formed on front surface 11 of substrate 1.

In addition, diameter D of front surface 11 of substrate 1 is set to 110 mm or greater. By doing so, the number of semiconductor elements (chips) which can be formed on substrate 1 can be increased by using substrate 1 having a large area. Consequently, cost for manufacturing a semiconductor element can be reduced and productivity in the step of forming a semiconductor element can be improved.

It is noted that surface roughness Ra can be measured with AFM or an optical interferometer-type roughness tester. Positions of measurement of surface roughness Ra are set to positions at intervals of 10 mm from a central portion of substrate 1 like a lattice, and a region outside a position distant by 5 mm from an outer circumferential portion of substrate 1 is excluded from a measurement target region. In addition, in the case where a bonded substrate as shown in FIG. 4 (substrate 1 formed by connecting a plurality of single crystal tile substrates 30 to one another) is employed as substrate 1, joint surface 31 (a joint portion) between adjacent single crystal tile substrates 30 is not set as a direct measurement position but surface roughness Ra is measured at a front surface of single crystal tile substrate 30 adjacent to joint surface 31.

In the substrate above, nitrogen concentration in single crystal silicon carbide may be not higher than $2 \times 10^{19}/cm^3$. In addition, in substrate 1 above, nitrogen concentration in single crystal silicon carbide above may be not lower than $4 \times 10^{18}/cm^3$ and not higher than $2 \times 10^{19}/cm^3$. Moreover, from a point of view of suppression of occurrence of a stacking fault, nitrogen concentration in single crystal silicon carbide can preferably be not higher than $5 \times 10^{18}/cm^3$. In this case, electrical resistance of substrate 1 can be lowered to some extent and extension of a stacking fault in substrate 1 during heat treatment for forming an epitaxial layer can be suppressed, and consequently warp of substrate 1 can be suppressed. Though nitrogen concentration in an atmosphere during growth of silicon carbide should be lowered in order to lower nitrogen concentration in single crystal silicon carbide, under such an atmospheric condition, introduction of a poly type in grown silicon carbide is likely. Therefore, from a point of view of suppression of introduction of a poly type in silicon carbide in substrate 1 and suppression of extension of a stacking fault, nitrogen concentration above is preferably not lower than $1 \times 10^{18}/cm^3$ and not higher than $2 \times 10^{19}/cm^3$, more preferably not lower than $4 \times 10^{18}/cm^3$ and not higher than $2 \times 10^{19}/cm^3$, and further preferably not lower than $6 \times 10^{18}/cm^3$ and not higher than $1.5 \times 10^{19}/cm^3$. In this case, lowering in electrical resistance of substrate 1 and suppression of extension of a stacking fault (that is, suppression of warp) can both more reliably be achieved.

Preferably, relational expressions of 100≤D/T≤1000 and 0≤Wb/T≤0.2 are satisfied, where D represents a diameter of front surface 11, T represents a thickness of substrate 1, and Wb represents warp of the back surface in substrate 1 above. In this case, the present invention is applied to relatively large substrate 1 less in warp, and an effect of the present invention that a probability of a defect produced in the step of forming an epitaxial layer or the process for manufacturing a semiconductor element can be lowered is more significant.

Here, the reason why a lower limit of D/T above is set to 100 is because handling of substrate 1 or automatic transportation of substrate 1 in a device process is facilitated. In addition, the reason why an upper limit value of D/T is set to 1000 is because reduction in warp of substrate 1 is facilitated and a probability of occurrence of fracture of substrate 1 can be lowered. Though Wb/T is preferably smaller, the reason why an upper limit value of Wb/T is set to 0.2 is because uniformalization of a substrate temperature in the step of forming an epitaxial layer is easy and correction of warp at the time of sticking by vacuum is easy and hence formation of a fine pattern through photolithography is facilitated.

It is noted that diameter D of substrate 1 can be, for example, not smaller than 110 mm and not greater than 300 mm. In addition, thickness T of substrate 1 can be, for example, not smaller than 500 μm and not greater than 800 μm. Moreover, warp Wb of the back surface of substrate 1 can be, for example, not greater than 60 μm, preferably not greater than 40 μm, and more preferably not greater than 20 μm. It is noted that warp herein refers to a value obtained by calculating a least square plane from a plurality of displacement values corresponding to a plurality of measurement points represented as two-dimensional positional data and calculating the sum of a distance between a greatest displacement value toward one side with respect to the least square plane and the least square plane and a distance between a greatest displacement value toward the other side and the least square plane.

Though warp of substrate 1 can be suppressed with large thickness T of substrate 1, thickness T exceeding 800 μm may cause such a problem as insufficient ability to stick substrate 1 by vacuum during handling of substrate 1, automatic transportation of substrate 1, or the like. In addition, cost for a material for substrate 1 increases. On the other hand, when thickness T of substrate 1 is smaller than 500 μm, it may be difficult to handle substrate 1 as free-standing substrate 1. In addition, a probability of occurrence of fracture increases and warp is likely to be great. Furthermore, warp Wb of substrate 1 exceeding 60 μm is likely to lead to deterioration of film quality of an epitaxial layer formed on substrate 1 or lowering in yield of a semiconductor element formed on substrate 1.

In substrate 1 above, diameter D of the front surface may be not smaller than 125 mm and not greater than 300 mm. From a point of view of higher productivity in a step of forming a semiconductor element on substrate 1, diameter D of substrate 1 is desirably as great as possible (for example, not smaller than 110 mm as above and more preferably not smaller than 125 mm). On the other hand, when diameter D of substrate 1 exceeds 300 mm, highly sophisticated process control is required for suppressing warp of substrate 1, and lowering in productivity may be caused.

In substrate 1 above, crystal structure of silicon carbide in the part of front surface 11 may be a 4H type, and the part of front surface 11 may include a crystal plane having an off angle with respect to a {0001} plane not smaller than 0.1° and not greater than 10°. Alternatively, the part of front surface 11 may include a crystal plane having an off angle with respect to a {000-1} plane not smaller than 0.01° and not greater than 6°. In this case, when a semiconductor element is formed by forming an epitaxial layer on the front surface of substrate 1, a semiconductor element (such as UMOS 410 in FIG. 5) having excellent electrical characteristics can be obtained.

In substrate 1 above, crystal structure of silicon carbide in the part of front surface 11 may be a 4H type, and the part of front surface 11 may include a crystal plane having an off angle with respect to a {03-38} plane or a back surface thereof not greater than 4°. In this case, when an oxide film is formed on front surface 11 of substrate 1 or when an epitaxial layer is formed and thereafter an oxide film is formed on a front surface thereof, an oxide film having good film quality can be obtained. Therefore, for example, when a MOSFET is formed as a semiconductor element, a MOSFET having excellent electrical characteristics can be obtained. In addition, the part of front surface 11 may include a crystal plane having an off angle with respect to a {01-11} plane or a back surface thereof not greater than 4° or a crystal plane having an off angle with respect to a {01-12} plane or a back surface thereof not greater than 4°. In this case, an oxide film having similarly good film quality can be obtained.

In substrate 1 above, crystal structure of silicon carbide in the part of front surface 11 may be a 4H type, and the part of front surface 11 may include a crystal plane having an off angle with respect to a {000-1} plane not smaller than 0.01° and not greater than 6°. In this case, when a semiconductor element is formed by forming an epitaxial layer on the front surface of substrate 1, a semiconductor element (such as UMOS 410 in FIG. 5 or DMOS 420 in FIG. 7) having excellent electrical characteristics can be obtained.

In substrate 1, a process-damaged layer may be formed on front surface 11, and the process-damaged layer may have a thickness of 10 nm and more preferably a thickness not greater than 5 nm. The process-damaged layer is a layer of which crystal lattice produced in the front surface of the substrate is distorted due to such working as grinding or polishing. In silicon carbide, faults are likely to be caused in a direction of a base plane and a process-damaged layer is likely. Presence and thickness of a process-damaged layer can be evaluated through TEM observation of a cross-section formed by cleavage or the like. By thus setting a thickness of the process-damaged layer on front surface 11 to be relatively small, an epitaxial layer having good film quality can be formed on front surface 11. In addition, a process-damaged layer may be formed also on back surface 12, and the process-damaged layer may have a thickness not greater than 200 nm and more preferably not greater than 100 nm. By restricting a thickness of the process-damaged layer on back surface 12 in the range as above, generation of a stacking fault at back surface 12 of substrate 1 during heat treatment can reliably be suppressed. Consequently, warp of substrate 1 can be suppressed.

In addition, as shown in FIG. 2, substrate 1 may be formed of one silicon carbide (SiC) single crystal, or as shown in FIG. 4, it may be a combined substrate including base substrate 20 serving as a strength retention portion and a front surface portion containing silicon carbide and formed on a front surface of base substrate 20 (a joint structure of single crystal tile substrates 30). The front surface portion may be, for example, a joint structure formed by joining a plurality of single crystal tile substrates 30 composed of silicon carbide. The strength retention portion above does not have to be composed of single crystal SiC so long as it has sufficient heat resistance and strength. In addition, at least a part of an upper surface of the front surface portion should only be composed of single crystal SiC.

From a point of view of heat resistance and strength, silicon carbide is preferably used as a material for base substrate 20 serving as the strength retention portion. Silicon carbide to be used may be any of polycrystal grown by vapor deposition, a sintered body formed by sintering an inorganic source material or an organic source material, and a single crystal. At least a part of a front surface (an upper surface) of the front surface portion, on which an epitaxial layer is to be formed, should be composed of single crystal SiC, because the epitaxial layer is formed on the front surface portion.

In the case where substrate 1 is formed of one piece of single crystal SiC, a process for manufacturing substrate 1 (single crystal SiC substrate) may include such steps as crystal growth (SiC single crystal ingot formation) (S11), ingot shaping and working (S12), ingot slicing (S13), and grinding (S21), polishing (S22), and cleaning (S30) of a substrate obtained by slicing. Meanwhile, the process for manufacturing a combined substrate described above is constituted of crystal growth (formation of an SiC single crystal ingot) (S11), ingot shaping and working (S12), ingot slicing (S13), tile forming and working (S14) by cutting a single crystal tile substrate from the substrate obtained by slicing, bonding (S15) of the single crystal tile substrate to the front surface of the base substrate, and grinding (S21), polishing (S22), and cleaning (S30) of the combined substrate.

From a different point of view, the method of manufacturing substrate 1 according to this invention includes the steps of preparing an ingot composed of silicon carbide (the crystal growth step (S11) and the ingot shaping step (S12)), obtaining a substrate having a front surface and a back surface as well as a diameter of the front surface not smaller than 110 mm by slicing the ingot (the slicing step (S13)), and polishing the front surface and the back surface of the substrate (the surface treatment step (S20)). In the polishing step (the surface treatment step (S20)), by controlling a resistance coefficient R in the polishing step (the surface treatment step (S20)), front surface 11 and back surface 12 are polished such that an average value of surface roughness Ra at front surface 11 is not greater than 0.5 nm and a standard deviation of surface roughness Ra is not greater than 0.2 nm and such that an average value of surface roughness Ra at back surface 12 is not smaller than 0.3 nm and not greater than 10 nm and a standard deviation of surface roughness Ra is not greater than 3 nm. Thus, substrate 1 according to the present invention can reliably be obtained.

A close-spaced sublimation method or a joint method using an adhesive can be used for bonding between the strength retention portion (base substrate 20) and single crystal tile substrate 30 forming the front surface portion and bonding between single crystal tile substrates 30. Any of an organic adhesive and an inorganic adhesive may be employed so long as strength of substrate 1 can be retained. In addition, a polymer such as polycarbosilane, which contains silicon (Si) and carbon (C) and forms SiC bond as a result of heating, may also be used as an adhesive. Since a combined substrate is not restricted in terms of an orientation of crystal growth or a size, a substrate having a front surface having a desired plane orientation and a desired size can be obtained. In addition, since an inexpensive polycrystalline or sintered body or a single crystal having many dislocations or defects can be employed as the strength retention portion (base substrate 20) and single crystal SiC (single crystal tile substrate 30) forming the front surface portion can be small in thickness, cost for a material for substrate 1 can be reduced and inexpensive substrate 1 can be realized. On the other hand, since substrate 1 composed of one piece of single crystal SiC does not require tile forming or bonding as in a combined substrate, a process for manufacturing substrate 1 can be simplified.

A semiconductor device (UMOS 410 or DMOS 420) according to this invention includes substrate 1 above, an epitaxial layer (n⁻ type SiC epitaxial layer 102), and an electrode (gate electrode 122, source electrode 121). The epitaxial layer is formed on front surface 11 of substrate 1 and composed of silicon carbide. The electrode (gate electrode 122, source electrode 121) is formed on the epitaxial layer. In this case, a semiconductor device achieving a lowered probability of production of defects and suppressed manufacturing cost can be realized.

A method of manufacturing a semiconductor device according to this invention includes the steps of preparing the substrate above (S100), forming an epitaxial layer (n⁻ type SiC epitaxial layer 102) composed of silicon carbide on a front surface of substrate 1 (S200), and forming an electrode on the epitaxial layer (the electrode formation step (S400)). In this case, by using substrate 1 according to the present invention, a probability of production of defects is lowered and cost for manufacturing a semiconductor device can be suppressed.

In the method of manufacturing substrate 1 or the method of manufacturing a semiconductor device described above, lapping, polishing, or the like can be employed as a polishing method for controlling surface roughness Ra of substrate 1. In particular, front surface 11 of substrate 1 is preferably polished in CMP treatment in finishing polishing, in order to lower surface roughness and to reduce a process-damaged layer. Abrasive grains used in CMP treatment are preferably composed of a material softer than silicon carbide in order to lower surface roughness and to reduce a process-damaged layer. Specifically, colloidal silica or fumed silica is preferably employed as a material for abrasive grains. Regarding a condition of a solution used in CMP treatment, in order to enhance chemical action, pH is preferably not higher than 4 or not lower than 9.5, and pH is more preferably not higher than 2 or not lower than 10.5. In addition, an oxidizer is preferably added to the solution. A chlorine based oxidizer such as trichloroisocyanuric acid or dichloroisocyanuric salt, sulfuric acid, nitric acid, a hydrogen peroxide solution, or the like can be used as an oxidizer.

In order to lower surface roughness Ra at front surface 11 of substrate 1 and to reduce in-plane distribution of surface roughness Ra, resistance coefficient R ($m^2/s$) represented by viscosity η (mPa·s) and a liquid flow rate Q ($m^3/s$) of a polishing liquid for finishing polishing, and an area S ($m^2$), a polishing pressure P (kPa), and a peripheral speed V (m/s) of a polishing surface plate (resistance coefficient R expressed by an equation $R=\eta \times Q \times V/S \times P$) is preferably not smaller than $3.0 \times E-15$ and not greater than $1.0 \times E-14$. By thus controlling a resistance coefficient between a polisher and substrate 1 in the polishing step, surface roughness Ra can be controlled in an appropriate range while an appropriate polishing speed is maintained, and variation in in-plane distribution can be reduced. A polisher is desirably a resin surface plate or an abrasive cloth such as polyurethane foam, nonwoven fabric, or suede, and in particular, a suede type is preferred.

Lapping, polishing, or the like can be employed for polishing of back surface 12 of substrate 1. Polishing using fine diamond abrasive grains is preferably applied as finishing polishing. Though CMP treatment can lower surface roughness at a polished surface, disadvantageously, process cost is more expensive than in other methods or productivity in the process is lower than in other methods. The diamond abrasive grains above each have a grain size preferably not smaller than 0.1 µm and not greater than 3 µm. A metal surface plate made of tin, a tin alloy, or the like, a resin surface plate, or an abrasive cloth can be employed as a polisher to be used for polishing. By using a metal surface plate, a polishing rate can be improved. Alternatively, by using an abrasive cloth as a polisher, surface roughness at a polished surface can be lowered. In order to lower surface roughness Ra at the back surface of the substrate and to reduce in-plane distribution of surface roughness Ra, resistance coefficient R in finishing polishing can be not smaller than $3.0 \times E-18$ and not greater than $1.0 \times E-17$. By controlling resistance coefficient R, in the step of polishing substrate 1, variation in in-plane distribution of surface roughness at a polished surface can be reduced while an appropriate polishing speed is maintained.

EXAMPLE 1

A combined substrate by way of example of a substrate according to the present invention and a semiconductor element including the combined substrate were fabricated as below and yield of the fabricated semiconductor element was examined.

(Manufacturing of Substrate)

Single crystal of SiC was grown with a sublimation method to thereby form an ingot. A seed substrate composed of single crystal silicon carbide and source material powders composed of silicon carbide were introduced in a vessel composed of graphite. An SiC single crystal substrate having a (0001) plane as a main surface and a diameter of 50 mm was employed as the seed substrate. Then, as the source material powders were heated, silicon carbide sublimated and recrystallized on the seed substrate. Here, recrystallization proceeded while nitrogen was introduced as an impurity. Then, heating was stopped at the time point when crystal having a desired size was grown on the seed substrate, and the crystal of single crystal silicon carbide was taken out of the vessel. Nitrogen concentration in the ingot was $1 \times E19/cm^3$. Then, a crystal growth plane, an underlying substrate surface, and an outer circumference of the ingot were ground with an outer circumference grinder and an ingot composed of SiC and shaped was obtained.

Thereafter, the substrate was cut by slicing the shaped ingot. Slicing was carried out by using a multi wire saw. In order to set {03-38} as the substrate surface after slicing, the ingot was set in a wire saw apparatus and subjected to the slicing step while the (0001) plane of the ingot was inclined by 54.7° from a direction of running of the wire. A thickness of the substrate after slicing was 250 µm. Then, by dicing an outer circumference of the substrate after slicing, a single crystal tile substrate having a quadrangular two-dimensional shape and having a size of 20 mm long×30 mm wide was obtained.

Then, in order to form a base substrate, initially, an ingot composed of polycrystalline SiC was formed with a sublimation method. By subjecting the ingot to outer circumference working, a shaped ingot having a diameter of 155 mm was obtained. By slicing the ingot with the multi wire saw, a polycrystalline substrate having a thickness of 500 µm was obtained. This polycrystalline substrate was employed as the base substrate.

Then, a plurality of single crystal tile substrates (single crystal rectangular substrates) were arranged on the base substrate (a polycrystalline underlying substrate) to be adjacent to one another, and the single crystal tile substrates were jointed to one another and the single crystal tile substrate and the base substrate were joined to each other with a closedspace sublimation method. The combined substrate thus obtained was subjected to outer circumference working to thereby obtain a substrate (a combined substrate) having a diameter of 150 mm and a thickness of 750 μm.

Thereafter, an underlying surface of the combined substrate (a back surface side of the base substrate) and a tile surface (a side where an upper surface of the single crystal tile substrate is exposed) were successively subjected to flattening working to thereby obtain a substrate for epitaxial processes. The underlying surface was ground with a diamond grindstone and thereafter polished with diamond slurry. In mirror-polishing to achieve surface roughness Ra from 0.3 to 10 nm and standard deviation not greater than 3 nm within the range according to the present invention, a resistance coefficient was set to $1.0 \times E-17$ m$^2$/s to $3.0 \times E-18$ m$^2$/s. In Examples 1 to 6, a resistance coefficient during polishing was set to $5.0 \times E-17$ m$^2$/s. An infeed type grinder was employed for grinding, and a vitrified-bonded grindstone having gauge #600 and a concentration ratio of 150 was employed as a grindstone. Polishing was performed in multiple steps. A μm. A groove had a depth of 3 μm and a width of 3 μm. A silicon oxide film was employed as a material for gate insulating film 107 and a thickness thereof was set to 40 nm. An alloy of Ti, Ni, and Al was employed as a material for gate electrode 122 and a thickness thereof was set to 0.5 μm. Polysilicon was employed as a material for interlayer insulating film 106 and a thickness thereof was set to 0.4 μm. An alloy of Ni and Si was employed as a material for source electrode 121. An alloy of Ni and Si was employed as a material for drain electrode 124. Before forming a back electrode, the substrate was reduced in thickness by back grinding to thereby leave the single crystal substrate by 100 μm.

In addition, a process condition for forming an element such as the step of forming an epitaxial layer was set for each sample.

(Contents and Results of Examination)

Yield for each sample was examined for the formed semiconductor element. Table 1 shows results.

TABLE 1

| Sample No. | | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| Front Surface Roughness | AV (nm) | 0.1 | 0.1 | 0.3 | 0.5 | 0.5 | 0.8 | 0.5 | 0.5 | 0.5 | 0.5 | 0.8 | 0.5 | 0.5 | 0.8 | 0.3 | 0.3 | 0.3 | 0.3 |
| | σ (nm) | 0.05 | 0.1 | 0.1 | 0.2 | 0.3 | 0.2 | 0.2 | 0.2 | 0.2 | 0.3 | 0.2 | 0.2 | 0.3 | 0.2 | 0.1 | 0.1 | 0.1 | 0.1 |
| Back Surface Roughness | AV (nm) | 1.5 | 1.5 | 1.5 | 1.5 | 1.5 | 1.5 | 1.5 | 10 | 10 | 10 | 10 | 0.3 | 0.3 | 0.3 | 0.3 | 0.4 | 5 | 10 |
| | σ (nm) | 0.5 | 1.5 | 0.5 | 0.5 | 0.5 | 0.5 | 3 | 4 | 3 | 3 | 3 | 0.1 | 0.1 | 0.1 | 0.1 | 0.1 | 1.5 | 3 |
| Device Yield (%) | | 76 | 73 | 72 | 58 | 35 | 38 | 28 | 32 | 52 | 30 | 29 | 55 | 32 | 33 | 60 | 66 | 65 | 59 | copper surface plate and a tin surface plate were employed as surface plates. Diamond slurry having a grain size of 3 μm and 1 μm was employed.

For working of a tile surface, CMP was carried out after grinding and lapping. Colloidal silica having an average grain size of 50 nm was employed as abrasive grains in slurry for CMP. Slurry was set to pH 2, which was acid owing to nitric acid, and a hydrogen peroxide solution was employed as an oxidizer. A suede type was employed as an abrasive cloth. A resistance coefficient during CMP was set to $1.0 \times E-14$ m$^2$/s to $3.0 \times E-15$ m$^2$/s in the range of the present invention. In Example 3, it was set to $2.0 \times E15$ m$^2$/s.

Then, by changing a condition for flattening working of the underlying surface and the tile surface, 18 types of substrate samples (samples Nos. 1 to 18) different in surface roughness as shown in Table 1 which will be described later were fabricated. It is noted that, as can be seen in Table 1 which will be described later, samples Nos. 1 to 4, 9, 12, and 15 to 18 were Examples according to the present invention, while samples Nos. 5 to 8, 10, 11, 13, and 14 were samples according to Comparative Examples.

(Manufacturing of Semiconductor Element)

A semiconductor element (device) was fabricated by using a substrate of each of samples Nos. 1 to 18 described above. A structure of the semiconductor element was set to the UMOS structure representing one type of vertical MOSFETs. A cross-sectional structure of the semiconductor element is the same as that of the semiconductor element shown in FIG. 5.

Specifically, n$^-$ type SiC epitaxial layer 102 had a thickness of 10 μm. P-type well region 117 had a thickness of 1.5 μm. P$^+$ type well contact impurity region 116 had a thickness of 0.2 μm. The n$^+$ type source impurity region had a thickness of 0.4

It can be seen that each of the samples according to Examples of the present invention achieved yield of a semiconductor element (device yield) not lower than 52%, while each of the samples according to Comparative Examples achieved yield of a semiconductor element lower than 40% and thus yield was clearly different. In addition, the samples according to Examples of the present invention were also good in terms of characteristics of formed semiconductor elements. Namely, it can be seen that, by controlling an average value of each of front surface roughness and back surface roughness and standard deviation σ of the substrate, a good epitaxially grown layer can be formed in most of large-sized substrates and warp of the substrate can be suppressed within an appropriate range. Then, consequently, according to Examples of the present invention, production of defects was suppressed, yield was improved, and good device characteristics were obtained.

EXAMPLE 2

A combined substrate and a semiconductor element including the combined substrate were fabricated, with a plane orientation of a single crystal tile substrate being differed from that in Example 1, and yield of the fabricated semiconductor element was examined.

(Manufacturing of Substrate)

A combined substrate was fabricated under the conditions the same as those in Example 1, except that a plane orientation of the single crystal tile substrate was set to {0001}. The plane orientation of the single crystal tile substrate was controlled by a direction of cutting at the time of slicing of an ingot. A thickness of a substrate after slicing was 250 μm. Then, by adjusting a working condition for flattening working, samples as Examples of the present invention and sample as Comparative Examples out of the range of the present invention were prepared.

(Manufacturing of Semiconductor Element)

Using a substrate which was a sample in each of Examples and Comparative Examples, a semiconductor element having the UMOS structure was formed basically in a manner the same as in Example 1.

(Contents and Results of Examination)

With the combined substrate having {0001} as a plane orientation in a main surface of the substrate as well, in samples according to Examples of the present invention, good yield and device characteristics could be obtained as in Example 1, owing to control of front surface roughness and back surface roughness. On the other hand, samples according to Comparative Examples were lower in yield than the samples according to Examples.

EXAMPLE 3

A substrate composed of one piece of single crystal SiC by way of example of the substrate according to the present invention and a semiconductor element including the substrate were fabricated as below, and yield of the fabricated semiconductor element was examined.

(Manufacturing of Substrate)

Single crystal of SiC was grown with a sublimation method to thereby form an ingot. An SiC single crystal substrate having a (0001) plane as a main surface and a diameter of 100 mm was employed as a seed substrate. Nitrogen concentration was $6\times E18/cm^3$. Then, a crystal growth plane, an underlying substrate surface, and an outer circumference of the ingot were ground with an outer circumference grinder and an ingot composed of SiC and shaped was obtained.

Thereafter, the substrate was cut by slicing the shaped ingot. Slicing was carried out by using a multi wire saw. The ingot was sliced such that a plane having an off angle of 2° from {0001} was set as the substrate surface after slicing and a substrate having a diameter of 110 mm was obtained.

Thereafter, a back surface and a front surface of the substrate after slicing were successively subjected to flattening working to thereby obtain a substrate for epitaxial processes. Flattening working was performed under the treatment conditions basically the same as those in treatment of the combined substrate in Example 1 above. A copper surface plate and a tin surface plate as well as an abrasive cloth were used for polishing the back surface of the substrate. Abrasive grains in diamond slurry having a grain size of 3 μm and 0.5 μm were employed. A resistance coefficient was not smaller than $6.0\times E-18\ m^2/s$ and not greater than $1.0\times E-17\ m^2/s$. In addition, after grinding and lapping of the front surface of the substrate, CMP was carried out as in Example 1. Colloidal silica having an average grain size of 60 nm was employed as abrasive grains in slurry for CMP. An unwoven type abrasive cloth was employed. A resistance coefficient during CMP was not smaller than $3.0\times E-15\ m^2/s$ and not greater than $8.0\times E-15\ m^2/s$. Then, by adjusting a working condition for flattening working, 13 types of substrate samples (samples Nos. 1 to 13) as shown in Table 2 which will be described later were fabricated. It is noted that, as can be seen in Table 2 which will be described later, samples Nos. 3, 4, and 9 to 13 were Examples according to the present invention, while samples Nos. 1, 2, and 5 to 8 were samples according to Comparative Examples.

(Manufacturing of Semiconductor Element)

Using a substrate which was a sample in each of Examples and Comparative Examples described above, a semiconductor element having the UMOS structure was formed basically in a manner the same as in Example 1.

(Contents and Results of Examination)

Yield for each sample was examined for the formed semiconductor element. Table 2 shows results.

TABLE 2

| Sample No. | | 1 | 2 | 3 | 4 | 5 | 6 | 7 | 8 | 9 | 10 | 11 | 12 | 13 |
|---|---|---|---|---|---|---|---|---|---|---|---|---|---|---|
| Front Surface Roughness | AV (nm) | 0.5 | 0.5 | 0.5 | 0.5 | 0.5 | 0.9 | 0.5 | 0.9 | 0.3 | 0.1 | 0.5 | 0.5 | 0.5 |
| | σ (nm) | 0.2 | 0.2 | 0.2 | 0.2 | 0.3 | 0.2 | 0.3 | 0.2 | 0.1 | 0.03 | 0.2 | 0.2 | 0.2 |
| Back Surface Roughness | AV (nm) | 16 | 10 | 10 | 0.3 | 10 | 10 | 0.3 | 0.3 | 10 | 10 | 5 | 0.4 | 1 |
| | σ (nm) | 3 | 4 | 3 | 0.2 | 3 | 3 | 0.1 | 0.1 | 3 | 3 | 1.5 | 0.1 | 0.1 |
| Device Yield (%) | | 29 | 31 | 54 | 56 | 32 | 31 | 37 | 34 | 64 | 68 | 62 | 65 | 68 |

The samples according to Examples of the present invention could achieve good device yield as in Example 1. Namely, by controlling an average value of each of front surface roughness and back surface roughness and standard deviation σ of the substrate, a good epitaxially grown layer could be formed in most of large-sized substrates and warp could be in an appropriate range. Consequently, according to Examples of the present invention, device yield could be improved and good device characteristics were obtained.

EXAMPLE 4

A substrate composed of one piece of single crystal SiC by way of example of the substrate according to the present invention as in Example 3 described above and a semiconductor element including the substrate were fabricated as below, and yield of the fabricated semiconductor element was examined.

(Manufacturing of Substrate)

Single crystal of SiC was grown with a sublimation method to thereby form an ingot. An SiC single crystal substrate having a (0001) plane as a main surface and a diameter of 100 mm was employed as a seed substrate. Nitrogen concentration was $6\times E18/cm^3$. Then, a crystal growth plane, an underlying substrate surface, and an outer circumference of the ingot were ground with an outer circumference grinder and an ingot composed of SiC and shaped was obtained.

Thereafter, the substrate was cut by slicing the shaped ingot. Slicing was carried out by using a multi wire saw. The ingot was sliced such that a plane having an off angle of 1° from {000-1} was set as the substrate surface after slicing and a substrate having a diameter of 130 mm was obtained.

Thereafter, a back surface and a front surface of the substrate after slicing were successively subjected to flattening working to thereby obtain a substrate for epitaxial processes. Flattening working was performed under the treatment conditions basically the same as those in treatment of the combined substrate in Example 1 above. A copper surface plate and a tin surface plate as well as an abrasive cloth were used for polishing the back surface of the substrate. Abrasive grains in diamond slurry having a grain size of 3 μm and 0.5 μm were employed. A resistance coefficient was not smaller than $3.0 \times E-18$ m²/s and not greater than $8.0 \times E-18$ m²/s. In addition, after grinding and lapping of the front surface of the substrate, CMP was carried out as in Example 1. Colloidal silica having an average grain size of 30 nm was employed as abrasive grains in slurry for CMP. A suede type abrasive cloth was employed. A resistance coefficient during CMP was not smaller than $6.0 \times E-15$ m²/s and not greater than $1.0 \times E-14$ m²/s. Then, by adjusting a working condition for flattening working, 9 types of substrate samples (samples Nos. 1 to 9) as shown in Table 3 which will be described later were fabricated. It is noted that, as can be seen in Table 3 which will be described later, samples Nos. 3, 4, and 7 to 9 were Examples according to the present invention, while samples Nos. 1, 2, 5, and 6 were samples according to Comparative Examples.

(Manufacturing of Semiconductor Element)

Using a substrate which was a sample in each of Examples and Comparative Examples described above, a semiconductor element having the DMOS structure shown in FIG. 7 was formed.

Specifically, n⁻ type SiC epitaxial layer 102 had a thickness of 10 μm. P-type well region 117 had a thickness of 1.5 μm. P⁺ type well contact impurity region 116 had a thickness of 0.2 μm. N⁺ type source impurity region 111 had a thickness of 0.4 μm. A silicon oxide film was employed as a material for gate insulating film 107 and a thickness thereof was set to 40 nm. An alloy of Ti, Ni, and Al was employed as a material for gate electrode 122 and a thickness thereof was set to 0.5 μm. Polysilicon was employed as a material for interlayer insulating film 106 and a thickness thereof was set to 0.4 μm. An alloy of Ni and Si was employed as a material for source electrode 121. An alloy of Ni and Si was employed as a material for drain electrode 124. Before forming a back electrode, the substrate was reduced in thickness by back grinding to thereby leave the single crystal substrate by 100 μm.

(Contents and Results of Examination)

Yield for each sample was examined for the formed semiconductor element. Table 3 shows results.

TABLE 3

| Sample No. | | 1 | 2 | 3 | 4 | 5 | 6 | 7 | 8 | 9 |
|---|---|---|---|---|---|---|---|---|---|---|
| Front Surface Roughness | AV (nm) | 0.5 | 0.5 | 0.5 | 0.5 | 1 | 0.5 | 0.3 | 0.1 | 0.3 |
| | σ (nm) | 0.2 | 0.2 | 0.2 | 0.2 | 0.2 | 0.3 | 0.1 | 0.05 | 0.1 |
| Back Surface Roughness | AV (nm) | 14 | 10 | 10 | 0.3 | 10 | 10 | 10 | 10 | 0.3 |
| | σ (nm) | 3 | 4 | 3 | 0.2 | 3 | 3 | 3 | 3 | 0.1 |
| Device Yield (%) | | 28 | 29 | 51 | 60 | 32 | 34 | 58 | 66 | 67 |

The samples according to Examples of the present invention could achieve good device yield as in Example 1. Namely, by controlling an average value of each of front surface roughness and back surface roughness and standard deviation σ of the substrate, a good epitaxially grown layer could be formed in most of large-sized substrates and warp could be in an appropriate range. Consequently, according to Examples of the present invention, device yield could be improved and good device characteristics were obtained.

The present invention is particularly advantageously applied to a substrate containing silicon carbide, a semiconductor device, and a method of manufacturing the same.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A substrate having a front surface and a back surface, the back surface having a distorted crystal lattice, and at least a part of said front surface is composed of single crystal silicon carbide,
said substrate having an average value of surface roughness Ra at said front surface not greater than 0.5 nm and a standard deviation of said surface roughness Ra not greater than 0.2 nm, and an average value of surface roughness Ra at said back surface not smaller than 0.3 nm and not greater than 10 nm and a standard deviation of said surface roughness Ra not greater than 3 nm, and a diameter of said front surface not smaller than 110 mm.

2. The substrate according to claim 1, wherein
nitrogen is introduced in said single crystal silicon carbide, and concentration of said nitrogen in said single crystal silicon carbide is not higher than $2 \times 10^{19}$/cm³.

3. The substrate according to claim 1, wherein
nitrogen is introduced in said single crystal silicon carbide, and concentration of said nitrogen in said single crystal silicon carbide is not lower than $4 \times 10^{18}$/cm³ and not higher than $2 \times 10^{19}$/cm³.

4. The substrate according to claim 1, wherein
relational expressions of $100 \le D/T \le 1000$ and $0 \le Wb/T \le 0.2$ are satisfied, where D represents a diameter of said front surface, T represents a thickness of said substrate, and Wb represents warp of said back surface.

5. The substrate according to claim 1, wherein
said front surface has a diameter not smaller than 125 mm and not greater than 300 mm.

6. The substrate according to claim 1, wherein
crystal structure of silicon carbide in said part of said front surface is a 4H type, and said part of said front surface includes a crystal plane having an off angle with respect to a {0001} plane not smaller than 0.1° and not greater than 10°.

7. The substrate according to claim 1, wherein
crystal structure of silicon carbide in said part of said front surface is a 4H type, and said part of said front surface includes a crystal plane having an off angle with respect to a {03-38} plane not greater than 4°.

8. The substrate according to claim 1, wherein
crystal structure of silicon carbide in said part of said front surface is a 4H type, and said part of said front surface includes a crystal plane having an off angle with respect to a {000-1} plane not smaller than 0.01° and not greater than 6°.

9. The substrate according to claim 1, composed of one piece of single crystal silicon carbide.

10. A semiconductor device, comprising:
the substrate according to claim 1; and
an epitaxial layer composed of silicon carbide and formed on said front surface of said substrate; and an electrode formed on said epitaxial layer.

11. A substrate having a front surface and a back surface, the back surface having a distorted crystal lattice, and at least part of said front surface is composed of single crystal silicon carbide,
said substrate having an average value of surface roughness Ra at said front surface not greater than 0.5 nm and a standard deviation of said surface roughness Ra not greater than 0.2 nm, and an average value of surface roughness Ra at said back surface of less than 0.3 nm, and a diameter of said front surface not smaller than 110 mm.

* * * * *